United States Patent

Mason

Patent Number: 5,382,453
Date of Patent: Jan. 17, 1995

[54] METHOD OF MANUFACTURING A HOLLOW SILICON CARBIDE FIBER REINFORCED SILICON CARBIDE MATRIX COMPONENT

[75] Inventor: Stephen Mason, Warwickshire, England

[73] Assignee: Rolls-Royce plc, London, England

[21] Appl. No.: 114,340

[22] Filed: Aug. 31, 1993

[30] Foreign Application Priority Data

Sep. 2, 1992 [GB] United Kingdom ............... 9218578

[51] Int. Cl.6 .................... C23C 16/00; B05D 3/02
[52] U.S. Cl. ................................ 427/249; 264/81;
427/226; 427/227; 427/294; 427/419.7
[58] Field of Search ............... 264/60, 62, 81, 129,
264/257, 259, 271.1, 317, 344; 427/227, 299,
376.2, 226, 249, 294, 419.7

[56] References Cited

U.S. PATENT DOCUMENTS

| | | | |
|---|---|---|---|
| 3,961,003 | 6/1976 | Parsels | 264/81 |
| 4,980,202 | 12/1990 | Brennan et al. | 427/249 |
| 5,018,271 | 5/1991 | Bailey et al. | 264/81 |
| 5,154,862 | 10/1992 | Reagan et al. | 264/60 |

FOREIGN PATENT DOCUMENTS 0228166 7/1987 European Pat. Off.
0461980 12/1991 European Pat. Off.

OTHER PUBLICATIONS

Derwent Publications Ltd, London, GB; AN 77-88734Y & JP-A-52 129 627 (Tohoku University) 31 Oct. 1977.
Japan Abstracs of Japan, vol. 009313, No. JP 60147503 10 Dec. 1985 (Mitsui Kosen KK).

Primary Examiner—Christopher A. Fiorilla
Attorney, Agent, or Firm—Cushman, Darby & Cushman

[57] ABSTRACT

Carbon coated carbide fibers are arranged in a predetermined pattern and shape around a silicon carbide coated graphite insert. Silicon carbide is infiltrated into the silicon carbide fibers to produce a SiC/SiC composite component. The SiC/SiC composite component is coated with glass and is then heated in air to burn out the graphite insert to form a hollow glass coated SiC/SiC composite component. The method is suitable for producing hollow SiC/SiC composite turbine blades or vanes.

13 Claims, 1 Drawing Sheet

U.S. Patent     Jan. 17, 1995     5,382,453 ns is that the internal cavities in the fiber preform
METHOD OF MANUFACTURING A HOLLOW SILICON CARBIDE FIBER REINFORCED SILICON CARBIDE MATRIX COMPONENT The present invention relates to a method of manufacturing hollow silicon carbide fiber reinforced silicon carbide matrix components, particularly hollow turbine blades or turbine vanes for gas turbine engines.

Solid silicon carbide fiber reinforced silicon carbide matrix components are known in the prior art. These components are produced by weaving the silicon carbide fibers into the required pattern and required shape to form a fiber preform. The silicon carbide fibers of the fiber preform are then coated with a thin layer of carbon by chemical vapor infiltration. The carbon has the role of debonding the fiber from the matrix and giving the component the required properties. The silicon carbide matrix is then deposited onto the fiber preform by chemical vapor infiltration.

The fiber preform is impregnated with a polymeric resin binder and the fiber preform is located in a graphite mold during the chemical vapor infiltration. The graphite mold is required to support the fiber preform during the chemical vapor infiltration process because the polymeric resin binder burns out of the fiber preform, during the heating up process for the chemical vapor infiltration, leaving just the fibers which cannot support themselves. It is necessary to use a graphite mold as this is one of the few materials which is not attacked by the toxic and corrosive gaseous precursors, e.g. methyltrichlorosilane, used to deposit silicon carbide by chemical vapor infiltration. The graphite mold is removed part way through the chemical vapor infiltration process after the fiber preform has undergone a hardening stage, after which it can support itself.

A problem associated with producing hollow silicon carbide fiber reinforced silicon carbide matrix components is that the internal cavities in the fiber preform have to be filled during the chemical vapor infiltration process because the fiber preform cannot support itself. The internal cavities may be filled to support the fiber preform using graphite inserts.

However, for components in which the internal cavities are completely enclosed, e.g. a hollow turbine blade or turbine vane, it is difficult to remove the graphite inserts. One possibility is to leave the graphite insert within the component, but in the case of turbine blades, or turbine vanes, this would increase the weight of the turbine blade or turbine vane and this is undesirable. A further possibility is to burn out the graphite inserts part way through the chemical vapor infiltration process, after the fiber preform has hardened, but the carbon, interface, layers on the silicon carbide fibers would also burn out at the same time hence destroying the composite.

Accordingly the present invention seeks to provide a novel method of manufacturing a hollow silicon carbide fiber reinforced silicon carbide matrix component which reduces, or overcomes, the above mentioned problems.

Accordingly the present invention provides a method of manufacturing a hollow silicon carbide fiber reinforced silicon carbide matrix component comprising the steps of (a) arranging the silicon carbide fibers in a predetermined pattern and in a predetermined shape around a silicon carbide coated graphite member to form a preform, (b) depositing silicon carbide onto the silicon carbide fibers of the preform to form a silicon carbide fiber reinforced silicon carbide matrix component, (c) coating the exterior surface of the silicon carbide fiber reinforced silicon carbide matrix component with glass, (d) heating the glass coated silicon carbide fiber reinforced silicon carbide matrix component in air/oxygen to burn out the graphite member to form a hollow glass coated silicon carbide fiber reinforced silicon carbide matrix component.

Preferably the method comprises arranging the silicon carbide fibers in a predetermined pattern and in a predetermined shape to form a preform having a hollow interior, the silicon carbide coated graphite member has an external shape and dimensions to match the hollow interior of the preform, inserting the silicon carbide coated graphite member into the hollow interior of the preform.

Preferably the method comprises coating the silicon carbide fibers with carbon after they are arranged in a predetermined pattern and a predetermined shape to form the preform. Preferably the silicon carbide fibers are impregnated with a polymeric resin to form the preform. Preferably the preform is supported on a graphite mold. Preferably the carbon is deposited onto the silicon carbide fibers by chemical vapor infiltration. Preferably the carbon is deposited on the silicon carbide fibers at high temperature and low pressure conditions. Preferably the silicon carbide is deposited onto the silicon carbide fibers, or carbon coated silicon carbide fibers, by chemical vapor infiltration. Preferably the silicon carbide is deposited onto the silicon carbide fibers, or carbon coated silicon carbide fibers, at high temperature and low pressure conditions. Preferably the high temperature is approximately 1000° C. to 1100° C. Preferably the silicon carbide is deposited by pyrolysis of methyltrichlorosilane.

The hollow component may be a turbine blade or turbine vane.

The present invention will be more fully described by way of example, with reference to the accompanying drawings in which.

Figure 1:
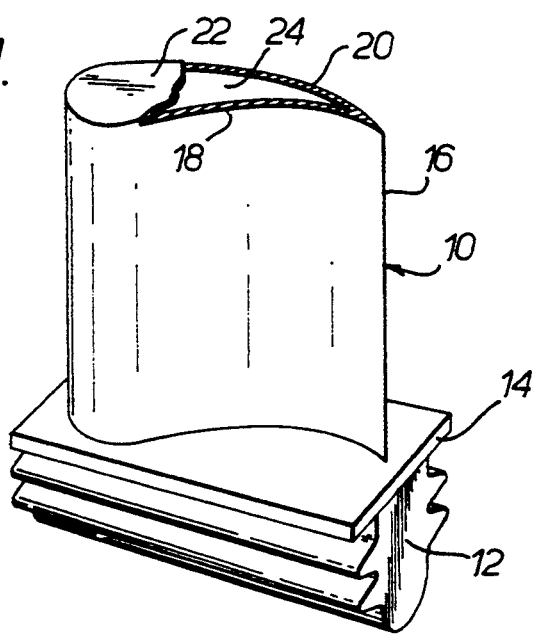
FIG. 1 is a partially cut away perspective view of a hollow silicon carbide fiber reinforced silicon carbide matrix turbine blade.

A hollow silicon carbide composite gas turbine engine blade 10, as shown in FIG. 1, comprises a root portion 12, a platform portion 14 and an aerofoil portion 16. The aerofoil portion 16 is hollow and comprises a concave pressure surface wall 18, a convex suction surface wall 20, and a tip wall 22 which define at least one internal cavity 24.

Figure 2:
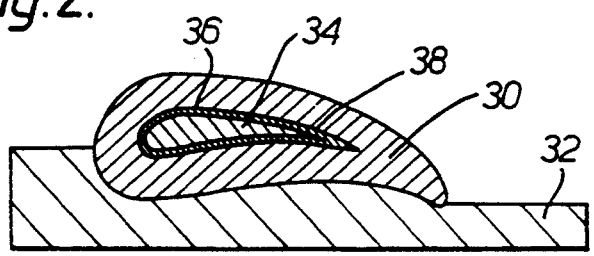
FIG. 2 is a diagram illustrating the method at a first point in the process.
Figure 3:
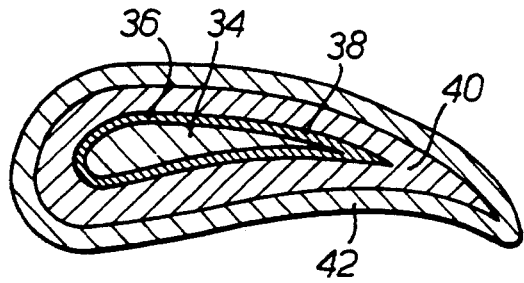
FIG. 3 is a diagram illustrating the method at a second part in the process.
Figure 4:
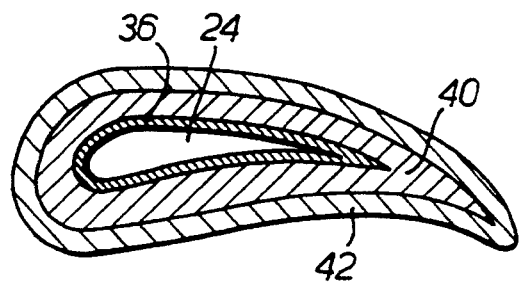
FIG. 4 is a diagram illustrating the last step of the process.

The hollow silicon carbide composite turbine blade 10 is manufactured using a method which is illustrated in FIGS. 2 to 4. The silicon carbide fibers are woven into a predetermined pattern and a required shape, to define the exterior shape of the component and the interior shape of the component. The silicon carbide fibers are approximately 40 volume % of the finished component, although other suitable volume fractions may be used. The silicon carbide fibers are typically Nicalon, Registered Trade Mark, or Tyranno, Registered Trade Mark. The silicon carbide fibers are then coated with carbon by pyrolysis from the gaseous phase at a suitably high temperature and at suitably low pressure conditions. A suitable temperature is approximately 1000° C. to 1100° C. The carbon layer has the role of debonding the fibers from the matrix to give the required properties in the SiC/SiC composite component. The carbon is deposited to a suitable thickness on the fibers, for example $0.4 \times 10^{-6}$ m. The silicon carbide fibers are impregnated with a polymeric resin binder to form a fiber preform.

The fiber preform 30, as shown in FIG. 2, is arranged on a graphite mold 32 which supports the silicon carbide fibers during the subsequent chemical vapor infiltration process. A graphite insert 34, which has a thin silicon carbide coating 36 is inserted into the cavity 38 defined by the interior shape of the fiber preform 30. Alternatively the fiber preform 30 is formed around the silicon carbide coated 36 graphite insert 34. The silicon carbide fibers are generally woven into a structure suitable for the component or shape being produced. The simplest and cheapest method is to weave the silicon carbide fibers into a two dimensional tape, which is then stacked and compressed to obtain the required thickness of material.

The fiber preform is then processed in the conventional manner to deposit the silicon carbide onto the carbon coated silicon carbide fibers to produce the silicon carbide matrix. The fiber preform 30, graphite insert 34 and graphite mold 32 are positioned within a vacuum chamber, which is evacuated to a suitably low pressure. The temperature in the vacuum chamber is increased to a suitably high temperature for the chemical vapor infiltration process, for example a temperature of 1000° C. to 1100° C. is suitable. At this temperature the polymeric resin binders on the fibers is evaporated and extracted from the vacuum chamber. A suitable gaseous precursor is then introduced into the vacuum chamber and silicon carbide is deposited onto the carbon coated silicon carbon fibers by pyrolysis to form a silicon carbide fiber reinforced silicon carbide matrix composite component 40, as shown in FIG. 3. In the pyrolysis process the fiber preform is heated in an atmosphere of hydrogen which has a low concentration of methlytrichlorosilane. The methyltrichlorosilane diffuses into the fiber preform and undergoes thermal decomposition in the reducing hydrogen atmosphere to deposit silicon carbide onto the carbon coated silicon carbide fibers. Hence the silicon carbide matrix is built up around the individual silicon carbide fibers. The carbon coated silicon carbide fibers in the fiber preform 30 are in intimate contact with the silicon carbide layer 36 on the graphite insert 34, the infiltration process has the effect of gluing the two together. The silicon carbide matrix is deposited to a thickness of $10-40 \times 10^{-6}$ m, typically $20 \times 10^{-6}$ m.

The graphite mold 32 is removed part way through the chemical vapor infiltration process after the fiber preform 30 has hardened, so that it may support itself.

At the end of the chemical vapor infiltration process, the SiC/SiC composite component is coated with glass 42, as shown in FIG. 3, to protect the SiC/SiC composite component from environmental attack.

The whole of the SiC/SiC composite component is then heated in air, or oxygen, to burn out the graphite insert 34 to leave a hollow interior 24 as shown in FIG. 4. The dense silicon carbide layer 36 between the carbon and the silicon carbide fibers allows the graphite insert 34 to be burnt out leaving the silicon carbide layer 36 inside the hollow interior 24. The silicon carbide layer 36 provides environmental protection without the need for a further glass coating.

Although the description has referred to only a single cavity within the hollow component, it is equally possible to use a plurality of silicon carbide coated graphite inserts to produce a plurality of cavities within the hollow component.

It may be possible to coat the silicon carbide fibers before they are woven into the required shape.

The carbon coating on the silicon carbide fibers may be applied by any other suitable methods.

I claim:

1. A method of manufacturing a hollow silicon carbide fiber reinforced silicon carbide matrix component comprising the steps of:
   (a) arranging silicon carbide fibers in a predetermined pattern and in a predetermined shape around a silicon carbide coated graphite member to form a preform,
   (b) vapor depositing silicon carbide onto the silicon carbide fibers of the preform to form a silicon carbide fiber reinforced silicon carbide matrix component having an exterior surface,
   (c) coating the exterior surface of the silicon carbide fiber reinforced silicon carbide matrix component with glass,
   (d) heating the glass coated silicon carbide fiber reinforced silicon carbide matrix component in oxygen to burn out the graphite member to form a hollow glass coated silicon carbide fiber reinforced silicon carbide matrix component.

2. A method as claimed in claim 1 comprising arranging the silicon carbide fibers in a predetermined pattern and in a predetermined shape to form a preform having a hollow interior, the silicon carbide coated graphite member has an external shape and dimensions to match the hollow interior of the preform, and inserting the silicon carbide coated graphite member into the hollow interior of the preform.

3. A method as claimed in claim 1 comprising coating the silicon carbide fibers with carbon after they are arranged in a predetermined pattern and a predetermined shape to form the preform.

4. A method as claimed in claim 3 comprising depositing the carbon onto the silicon carbide fibers by chemical vapor infiltration.

5. A method as claimed in claim 4 wherein the carbon is deposited onto the silicon carbide fibers at a temperature of 1000° C.–1100° C.

6. A method as claimed in claim 3 comprising depositing the silicon carbide onto the carbon coated silicon carbide fibers by chemical vapor infiltration.

7. A method as claimed in claim 6 wherein the silicon carbide is deposited onto the carbon coated silicon carbide fibers in vacuum at a temperature of 1000° C.–1100° C.

8. A method as claimed in claim 1 wherein step (a) includes impregnating the silicon carbide fibers with a polymeric resin to form the preform.

9. A method as claimed in claim 8 comprising supporting the preform on a graphite mold during the deposition of the silicon carbide.

10. A method as claimed in claim 1 comprising depositing the silicon carbide onto the silicon carbide fibers by chemical vapor infiltration.

11. A method as claimed in claim 10 wherein the silicon carbide is deposited onto the silicon carbide fibers in vacuum at a temperature of 1000° C.–1100° C.

12. A method as claimed in claim 1 wherein step (b) comprises depositing the silicon carbide onto the silicon carbide fibers of the preform by pyrolyzing methyltrichlorosilane.

13. A method as claimed in claim 1 comprising coating the silicon carbide fibers with carbon before they are arranged in the predetermined pattern and the predetermined shape to form the preform.

* * * * *